(12) United States Patent
Kwon et al.

(10) Patent No.: US 8,004,369 B2
(45) Date of Patent: Aug. 23, 2011

(54) ARRANGEMENT STRUCTURE OF ELECTROMAGNETIC BAND-GAP FOR SUPPRESSING NOISE AND IMPROVING SIGNAL INTEGRITY

(75) Inventors: Jong Hwa Kwon, Daejeon (KR); Dong-Uk Sim, Daejeon (KR); Sang Il Kwak, Daejeon (KR); Je Hoon Yun, Daejeon (KR); Chang-Joo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/578,849

(22) Filed: Oct. 14, 2009

(65) Prior Publication Data

US 2010/0156523 A1  Jun. 24, 2010

(30) Foreign Application Priority Data

Dec. 23, 2008 (KR) .................. 10-2008-0131836

(51) Int. Cl.
*H04B 3/32* (2006.01)
(52) U.S. Cl. ........... 333/12; 333/167; 333/185; 333/202
(58) Field of Classification Search ............ 333/12, 333/167, 168, 175, 185, 202, 204, 205; 174/260, 174/261, 262, 264, 360
See application file for complete search history.

(56) References Cited

U.S. PATENT DOCUMENTS

| | | | |
|---|---|---|---|
| 6,262,495 B1 | 7/2001 | Yablonovitch et al. | |
| 2007/0090398 A1 | 4/2007 | McKinzie, III | |
| 2007/0289771 A1* | 12/2007 | Osaka et al. ................. | 174/250 |

FOREIGN PATENT DOCUMENTS

KR  10-0723531 B1  5/2007

OTHER PUBLICATIONS

Dan Sievenpiper, et al; "High-Impedance Electromagnetic Surfaces with a Forbidden Frequency Band", IEEE Transactions on Microwave Theory and Techniques, vol. 47, No. 11, pp. 2059-2074, Nov. 1999, (exact date cannot be found).
Shahrooz Shahparnia, et al; "Electromagnetic Interference (EMI) Reduction From Printed Circuit Boards (PCB) Using Electromagnetic Bandgap Structures" IEEE Transactions on Electromagnetic Compatibility, vol. 46, No. 4, pp. 580-587, Nov. 2004 (exact date cannot be found).
Tzong-Lin Wu, et al; "Electromagnetic Bandgap Power/Ground Planes for Wideband Suppression of Ground Bounce Noise and Radiated Emission in High-Speed Circuits" IEEE Transactions on Microwave Theory and Techniques, vol. 53, No. 9, pp. 2935-2942, Sep. 2005, (exact date cannot be found).
J.H. Kwon, et al; "Partial placement of electromagnetic bandgap unit cells to effectively mitigate simultaneous switching noise", Electronics Letters, 23$^{rd}$ Oct. 2008, vol. 44, No. 22, pp. 1302-1303.

* cited by examiner

*Primary Examiner* — Robert Pascal
*Assistant Examiner* — Kimberly E Glenn
(74) *Attorney, Agent, or Firm* — Ladas & Parry LLP

(57) ABSTRACT

An electromagnetic-wave suppression structure in a multilayer PCB or package structure is supplied with a power to be used therein by a power distribution network including a power plane and a ground plane. The multilayer PCB and package includes: an electromagnetic-wave suppression structure including an electromagnetic band-gap; and the electromagnetic-wave suppression structure is formed at a specific portion(s) of the power plane and/or the ground plane to suppress noises.

8 Claims, 8 Drawing Sheets

ARRANGEMENT STRUCTURE OF ELECTROMAGNETIC BAND-GAP FOR SUPPRESSING NOISE AND IMPROVING SIGNAL INTEGRITY

CROSS-REFERENCE(S) TO RELATED APPLICATION

The present invention claims priority of Korean Patent Application No. 10-2008-0131836, filed on Dec. 22, 2008, which is incorporated herein by reference.

FIELD OF THE INVENTION

In general, an electric/electronic system using a high speed signal is applied with multilayer PCB (Printed Circuit Board) and package structure to provide various high technology functions. In order to stably supply a power and ground to devices and components in the PCB and package, the system has a power distribution network (PDN), formed of a pair of power plane and ground plane embedded within its multilayer structure. The present invention relates to a method for arranging an unwanted electromagnetic-wave suppression structure such as Electromagnetic Band-gap (EBG) for suppressing noises generating in a power distribution network used in the multilayer PCB and package. More particularly, the present invention relates to arrangement of electromagnetic-wave suppression structure in which an electromagnetic band-gap is arranged in a portion of the power plane and/or ground plane, and the other portion of that is used for a return current pass not only to suppress simultaneous switching noise (SSN) generated at the power/ground planes of the multilayer PCB structure or package, but also to minimize an effect to the high speed signal, thereby enhancing a signal characteristics.

BACKGROUND OF THE INVENTION

As electronics and semiconductor technology are rapidly developed, information communication devices are required to be multi-functional, miniaturized, and broadband with a high speed. As an operation speed of high speed digital system increases and a clock frequency is at several GHz, simultaneous switching noise (SSN) is generated in an on/off chip, a multi-layer printed circuit board (PCB) or a package structure and is problematic. The SSN can cause the significant problems with signal/power integrity (SI/PI), as well as electromagnetic interference (EMI), exciting the cavity resonance modes within parallel plate waveguide-type power/ground planes.

FIG. 1 is a diagram illustrating a current flow path, and SSN and EMI generation mechanism in a multilayer PCB or package structure using a high speed signal.

In the multi-layer PCB or package structure, a power distribution network (PDN) formed of a pair of power plane and ground plane is embedded within its multilayer structure. This PDN structure embedded in multilayer structure has a form of a parallel plate waveguide. FIG. 1 shows an example of a multi-layer PCB or package structure 100 using a high speed signal in which a layout of respective layers such as a signal layer, the power plane 140 and the ground plane 130 and an integrated circuit (IC) device 110 performing the fast switching operation, signal flow paths 180 and 185, and generation mechanism of SSN 195 and EMI 190 are illustrated.

Generally, it is known that simultaneous switching noise (SSN) 195 is the most severe noise in the multi-layer PCB or package structure 100. The SSN 195 is also called delta-I noise or ground bounce noise (GBN). This noise is generated between the power plane 140 and the ground plane 130 due to time-varying current that rapidly varies in a high-speed digital circuit. The SSN 195 may affect SI/PI of a circuit and cause radiation of unwanted electromagnetic-wave 190 at edges of the multi-layer PCB or package structure 100. Accordingly, suppression of the SSN 195 is a key concern in a high-speed digital computer system operating at a low voltage level with a high clock frequency.

A recent high-speed digital system has hundreds of simultaneously switched gates. When high speed current flows through a via 131, the via 131 through which the fast current flows functions as an antenna and the noises generated from via are propagated through the power distribution network, which has a form of parallel plate waveguide structure, formed of the power plane 140 and ground plane 130. And then the propagated noises may affect an adjacent signal lines or devices, finally causing the SI/PI problem. Further, the noises arrive at an edge of the structure radiates out unwanted electromagnetic-wave 195. That is, the unwanted electromagnetic-wave 195 is propagated to the entire PCB 100 through a dielectric layer 170 by resonance of parallel conductor plates and then emitted to the exterior at the edges of the PCB 100. The SSN 195 is inductive noise generated in a high-speed digital system due to rapid changes in current when output terminals of the digital gates are simultaneously switched. It is difficult to measure an amount of the SSN 195 since the SSN 195 depends on a form of the multi-layer PCB or package structure 100 or the current flow paths 180 and 185. The noise voltage due to the SSN may be simply expressed by Equation 1:

$$V_{noise} = N \cdot L_{eq} \frac{di}{dt} \qquad \text{[Equation 1]}$$

wherein $V_{noise}$ denotes a noise voltage generated due to SSN, N denotes the number of simultaneously switched gates, and $L_{eq}$ denotes the effective inductance of the power distribution network.

Conventional techniques for suppressing SSN in a multi-layer PCB or package structure include the application of a decoupling capacitor (DeCap), an embedded thin film capacitor, a stitching via, and ground filling in the multi-layer PCB.

The decoupling capacitor is a decoupling device having large capacitance and connected between the power plane and the ground plane. Researches for removing a parasite inductance component of a power plane and supplying a stable power using the decoupling capacitor has been proceeded steadily. However, a decoupling capacitor mounted in the multi-layer PCB may increase a production cost, make it difficult to dispose other devices in a limited space of the PCB, and cause another parallel resonance frequency due to its parasite inductance. In addition, the decoupling capacitor has too low operation frequency of hundreds of MHz to effectively suppress the SSN in a GHz band that is problematic in high-speed systems.

The embedded thin film capacitor has been developed to reduce the parasitic inductance component of the decoupling capacitor. The embedded thin film capacitor is manufactured by disposing a high dielectric material, as a thin film, between a power plane and a ground plane. The embedded capacitor can provide a better SSN suppression characteristic in a relatively high frequency band than the decoupling capacitor. However, the embedded capacitor requires a high dielectric thin film material and additional process in order to effectively suppress the SSN in a GHz band.

In addition, the stitching via, the ground filling and the like locally operates in only a limited region of a PCB/package structure and exhibits a noise suppression characteristic in only a narrow band at GHz frequency or less. Thus, these approaches have small effects in current GHz-class high-speed systems, as known.

Accordingly, electromagnetic control structures having electromagnetic-wave suppression characteristic in a specific frequency band, such as an Artificial Magnetic Conductor (AMC), a High Impedance Surface (HIS), and an electromagnetic band-gap (EBG), have been proposed to solve a noise problem in the GHz band.

The electromagnetic control structures have a periodic structure in which certain pattern unit cells are formed adjacent to one another. The electromagnetic control structures including the electromagnetic band-gap (EBG) structure have a high impedance characteristic in a specific frequency band, and accordingly a broadband rejection characteristic to surface current. In a multi-layer PCB or package structure, the EBG effectively suppresses SSN, improves SI/PI and EMI, and has a better frequency selection characteristic, compared to the decoupling capacitor and the embedded thin film capacitor. However, such an EBG structure initially proposed as a mushroom shape of a two-layer structure has problems of complex process of forming a blind via and high production cost.

Meanwhile, in order to solve these problems, an EBG structure having a periodic pattern provided only on a single surface has been proposed. The EBG structure provides process convenience and exhibits a noise reduction characteristic in a power distribution network (PDN) circuit in a parallel-plate waveguide form, but affects a high speed signal line to thereby degrade an SI characteristic.

SUMMARY OF THE INVENTION

Therefore, the present invention provides an electromagnetic-wave suppression structure such as an electromagnetic band-gap disposed on a portion of a power plane and/or a ground plane in a multilayer PCB or package structure not only to effectively suppress SSN, but also to improve SI/PI and EMI characteristics.

Further, the electromagnetic-wave suppression structure is disposed only near a noise source and/or a noise-sensitive component and a high speed signal line is disposed in a region without the electromagnetic-wave suppression structure to be used as a return current path to thereby improve a signal characteristic of an entire system. Furthermore, a size, a shape or a position of the electromagnetic-wave suppression structure is changed to ensure a band rejection characteristic corresponding to a use of the system.

In accordance with an aspect of the present invention, there is provided an arrangement structure of electromagnetic-wave suppression structure in a multilayer PCB or package structure supplied with a power to be used therein by a power distribution network including a power plane and a ground plane. The multilayer PCB and package an electromagnetic-wave suppression structure including an electromagnetic band-gap; and the electromagnetic-wave suppression structure is formed at a portion(s) of the power plane and/or the ground plane to suppress noises.

The electromagnetic-wave suppression structure may be formed near a noise source or a device sensitive to an electromagnetic-wave.

Regions in the power plane and the ground plane in which the electromagnetic-wave suppression structure is not formed are preferably used as a return current path for the high speed signal.

A high speed signal line may be formed on the regions in the power plane and ground plane in which the electromagnetic-wave suppression structure is not formed.

The electromagnetic-wave suppression structure may be formed on one of the power plane and the ground plane.

The electromagnetic-wave suppression structure including the electromagnetic band-gap may be formed partially or entirely on the both power plane and ground plane.

The electromagnetic-wave suppression structure formed on the power plane may be different from that formed on the ground plane in a size and form.

The electromagnetic-wave suppression structure including the electromagnetic band-gap preferably has a band rejection characteristic with respect to a surface current.

The electromagnetic-wave suppression structure including the electromagnetic band-gap may be formed by combining electromagnetic-wave suppression structures having a different cut-off frequency.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE EMBODIMENTS

Hereinafter, the embodiments of the present invention will be described in detail with reference to the accompanying drawings.

Figure 1:
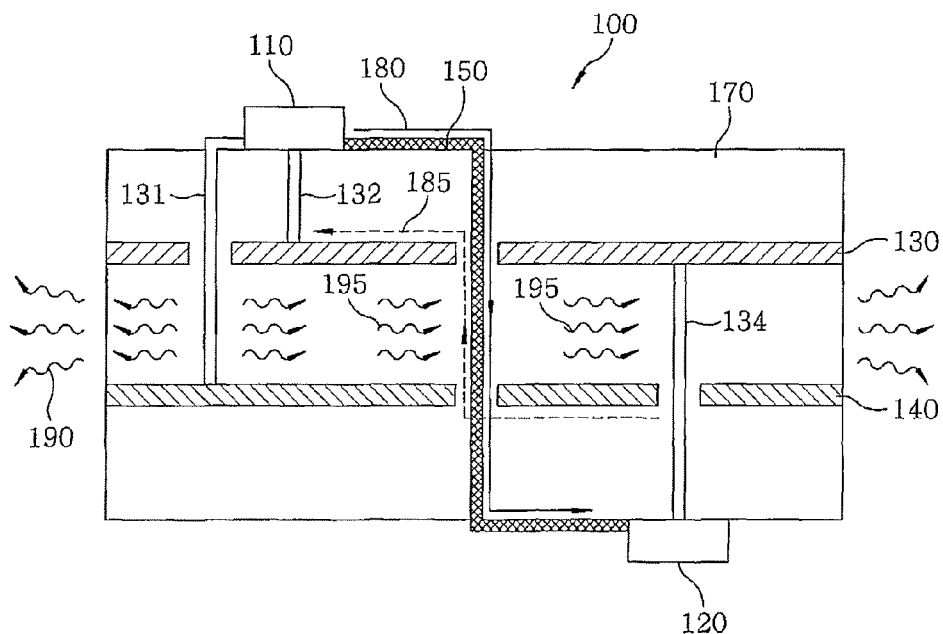
FIG. 1 is a diagram illustrating a current flow path, and SSN and EMI generation mechanism in a conventional multi-layer PCB or package structure using a high speed signal.

Referring to FIG. 1, there is shown a current flow path, and SSN and EMI generation mechanism in a conventional multi-layer PCB or package structure 100 using a high speed signal. In the conventional multi-layer PCB or package structure 100, a driving circuit 110 is connected to the power plane 140 and the ground plane 130 through via 131 to be supplied with a power therethrough. A signal generally flows from the driving circuit 110 to a load 120 along a metal signal line 150. Here, in case of a high speed signal, a return current path 185 is not established through only the ground plane 130 but along a path having low input impedance in each layer when the signal is at a higher frequency. That is, when a high frequency signal and/or a high speed signal is used, both the ground plane 130 and the power plane 140 may be used as the return current path 185.

Figure 2:
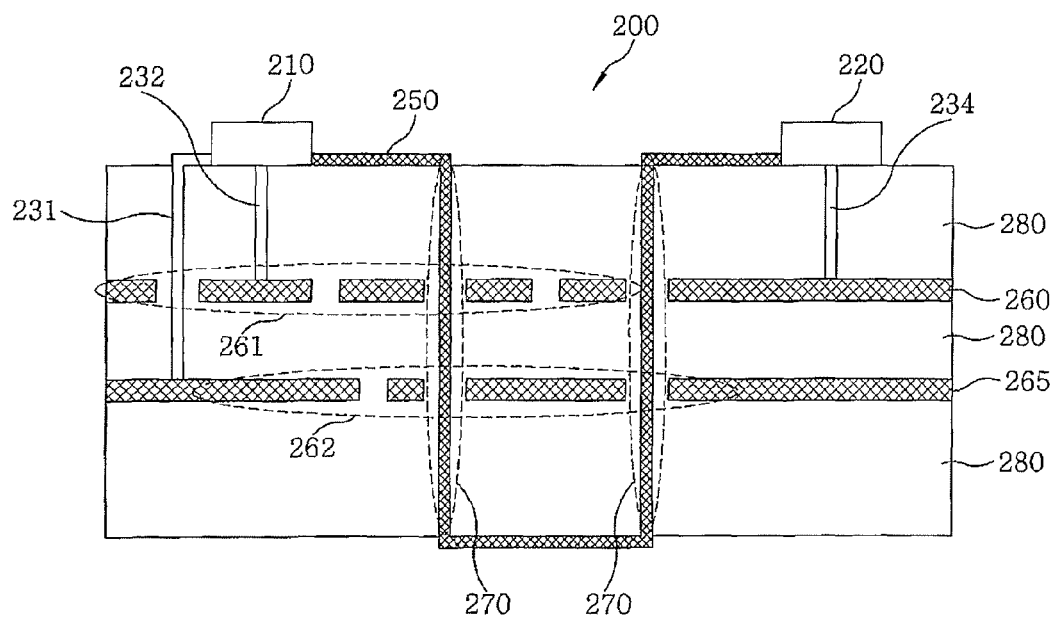
FIG. 2 is a cross-sectional view of a multi-layer PCB or package structure having an electromagnetic suppression structure in accordance with the present invention.

FIG. 2 is a cross-sectional view of arrangement of an electromagnetic suppression structure in accordance with the present invention.

In FIG. 2, a power distribution network is shown to have Electromagnetic Band-Gap (EBG) unit cells 261 and 262 that are provided in a specific portion of a power plane 265 and a ground plane 260 in a multi-layer PCB or package, respectively. A driving circuit 210 is connected to the power plane 265 and the ground plane 260 through vias 231, 232 and the like to be supplied with power therethrough. A signal generally flows from the driving circuit 210 to a load 220 along a metal signal line 250. The load 220 and the signal line 250 are formed as a structure of via 270. As shown in FIG. 2, an SSN is generated when time-varying current flows the vias 270 and 231 propagating the power plane and the ground plane. However, the SSN generated in a structure of a parallel plate wave guide configured with an inner dielectric layer 280 between the power plane 265 and the ground plane 260 is not delivered to circumference by surface current suppression characteristic of the EBGs (electromagnetic band-gaps) 261 and 262 formed directly on the power plane 265 and the ground plane 260. Meanwhile, the return current may flow through portions of the power plane 265 and the ground plane 260 where the EBGs 261 and 262 are not formed. This is because the portions of the power plane 265 and the ground plane 260 without the EBGs 261 and 262 are not formed have lower impedance than the EBG 261 and 262, which have a high-impedance characteristic in a specific high-frequency band. Accordingly, the return current path is obtained by, and an excellent signal characteristic of a system can be obtained when a high speed signal is applied.

Although a two-layer structure of the power plane 265 and the ground plane 260 including the EBG unit cells directly provided thereon has been described above, the present invention may also be applied to a multi-layer structure having four or more layer.

FIGS. 3A to 3D show an arrangement of an electromagnetic-wave suppression structure partially or entirely formed on a power plane or a ground plane according to an area of the structure in respective stages.

Figure 3A:
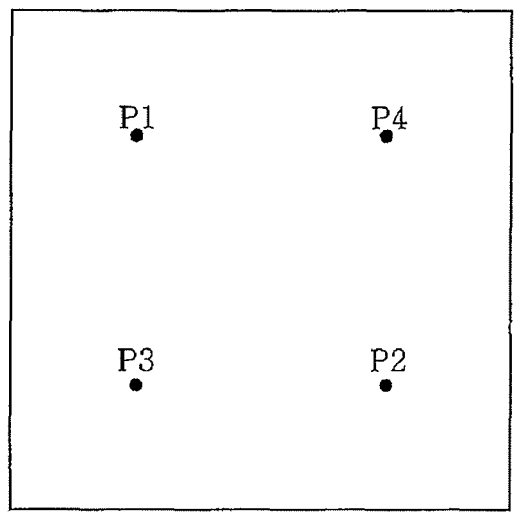
FIGS. 3A to 3D show an arrangement of an electromagnetic-wave suppression structure partially or entirely formed on a power plane or a ground plane according to an area of the structure in stages.
Figure 3B:
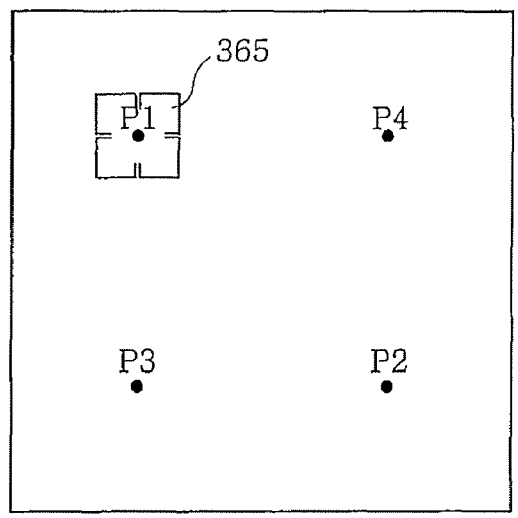
Figure 3C:
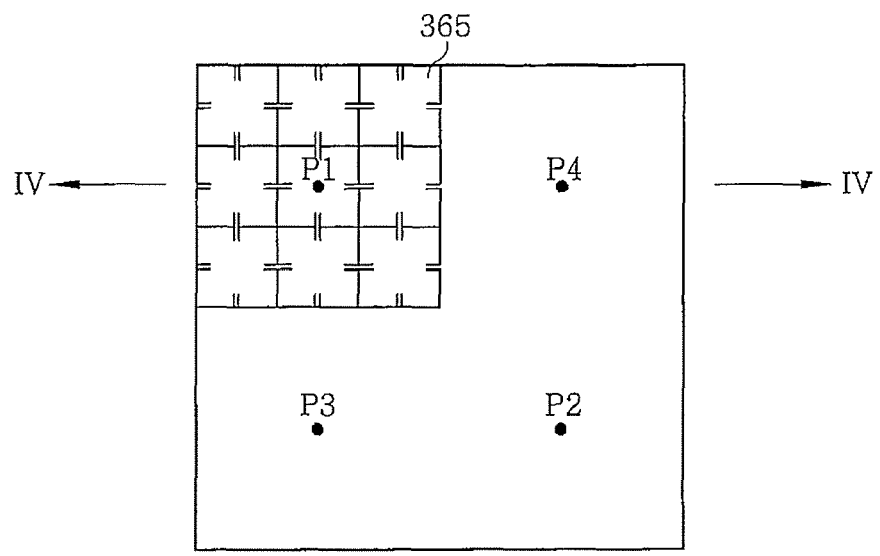
Figure 3D:
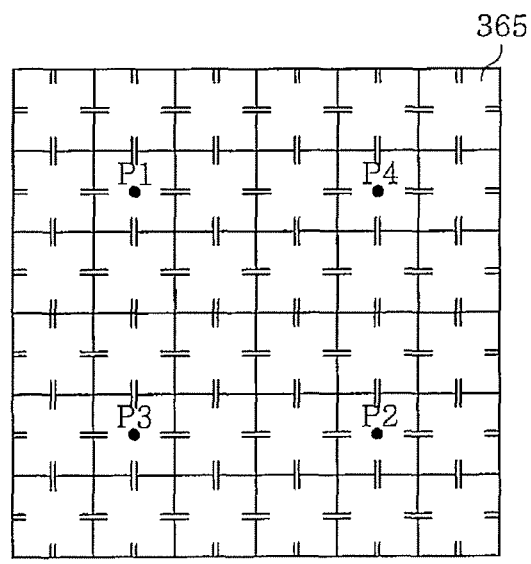

FIG. 3A illustrates a power plane or a ground plane formed with a conductive body in which electromagnetic-wave suppression structure is not formed, FIG. 3B illustrates a structure in which one EBG unit cell 365 is provided only at a noise source, FIG. 3C illustrates a structure in which nine EBG unit cells 365 are provided in some regions near a noise source, and FIG. 3D illustrates a structure in which EBG unit cells 365 are provided on an entire reference plane.

In these drawings, P1 to P4 denote positions of ports used when measuring and simulating a noise suppression characteristic. In the present embodiments, the EBG unit cell(s) 365 is(are) provided only on one of the ground plane and the power plane. Particularly, as can be seen from FIGS. 3B and 3C, the EBG unit cells are partially provided only near a noise source or a component sensitive to noise.

Figure 4:
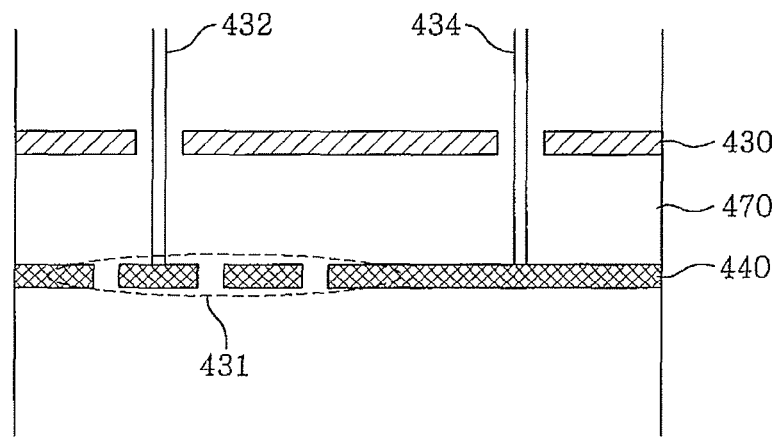
FIG. 4 is a cross sectional view of an electromagnetic-wave suppression structure which is partially formed on a power plane or a ground plane.

FIG. 4 is a cross-sectional view of the electromagnetic-wave suppression structure which is partially formed on a power plane. The drawing is obtained by taking along the line IV-IV in FIG. 3C. In the drawing, vias 432 and 434 in positions P1 and P4, electromagnetic band-gap 431 of three unit cells present on the P1-P4 among nine unit cells formed on the surface of the power plane 440 and a region without having the electromagnetic band-gap 431, and a ground plane 430 and a dielectric signal layer 470 are shown in FIG. 4.

If several same EBG unit cells are provided, an electromagnetic-wave suppression characteristic becomes good but a frequency band suppressed is same. Accordingly, the number of electromagnetic band-gap unit cells required between a noise source and an object to be protected may be determined by obtaining a required SSN suppression characteristic in consideration of an operation frequency of a system and an internal structure of a device, such as a multi-layer PCB or a package. The number of the EBG unit cells may depend on an EBG structure, however, generally, two or more EBG unit cells are required to obtain a suppression characteristic above about −30 dB.

Figure 5:
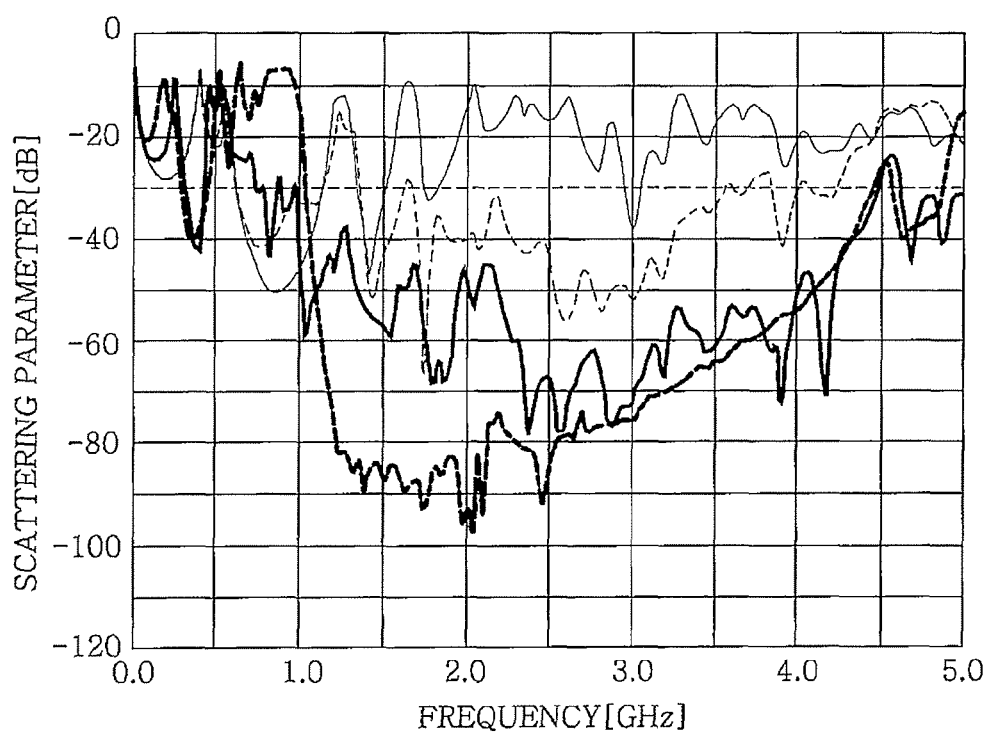
FIG. 5 illustrates a noise suppression characteristic when an electromagnetic-wave suppression structure is partially formed on a power plane or a ground plane.

FIG. 5 illustrates a noise suppression characteristic when an electromagnetic-wave suppression structure is partially formed on a power plane or a ground plane.

In FIG. 5, a noise delivery characteristic at ambient positions P2 to P4 is shown when a noise source is present in the position P1 in the structure in FIGS. 3A to 3D. Reference numeral 510 plots a curve of a noise delivery characteristic in a case where the reference plane is the metal layer as in FIG. 3A, 520 plots a curve of a noise delivery characteristic of the structure in which one EBG unit cell 365 is provided only on a noise source as shown in FIG. 3B. 530 plots a curve of a noise delivery characteristic of the structure in which nine EBG unit cells 365 are provided in some regions near a noise source as shown in FIG. 3C, and 540 denotes a noise delivery characteristic of the structure in which an EBG unit cells 365 are provided on an entire reference plane as shown in FIG. 3D and the noise delivery characteristic is described in a scattering parameter [dB] unit in a frequency band in a range from 0 to 5 GHz.

In the structure shown in FIG. 3C, the EBG unit cells 365 are actually provided corresponds to 25% of the entire reference plane, but the noise delivery characteristic curve 530 is substantially similar to the noise delivery characteristic curve 540 of the structure shown in FIG. 3D in which the EBG unit cells are provided on an entire reference plane. When the structure shown in FIG. 3C is used, a region without EBG unit cell can be used as a return current path while effectively shielding the SSN from the noise source.

Figure 6A:
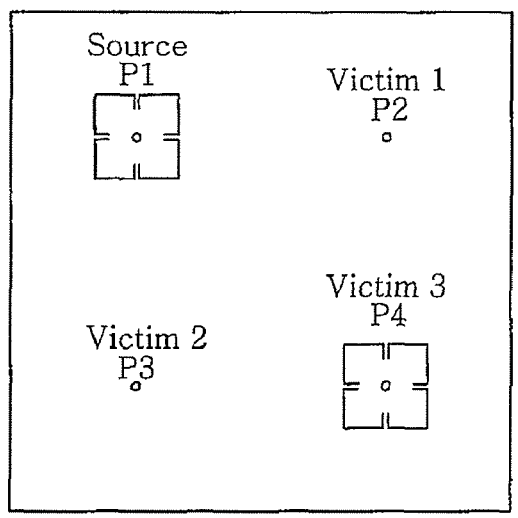
FIGS. 6A and 6B show planar planes of an electromagnetic-wave suppression structure partially formed on regions of a power plane or a ground plane.
Figure 6B:
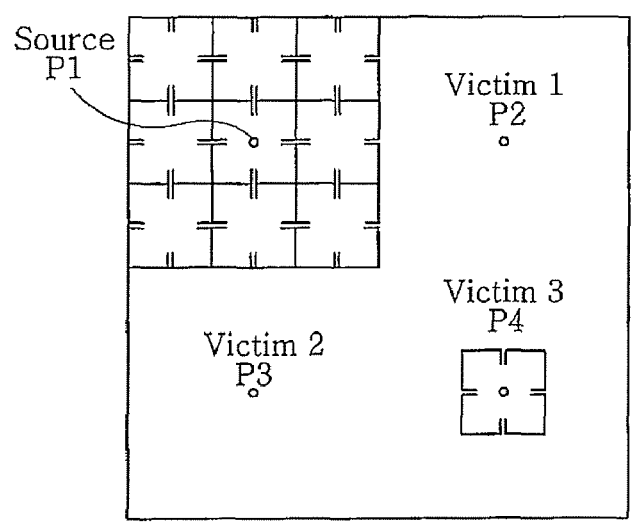

FIGS. 6A and 6B show planar surfaces of an electromagnetic-wave suppression structure partially formed on several regions of a power plane or a ground plane.

In these drawings, EBG structures are provided near a device sensitive to electromagnetic-wave, as well as a noise source. With this configuration, a noise suppression effect can be improved in the region where the EBG is provided. In FIG. 6A, the same number of the same EBG unit cells is provided. Meanwhile, in FIG. 6B, different numbers of the same EBG unit cells are provided. Alternatively, the EBG unit cells may be used in different number or size in order to extend a suppression frequency bandwidth.

Figure 7A:
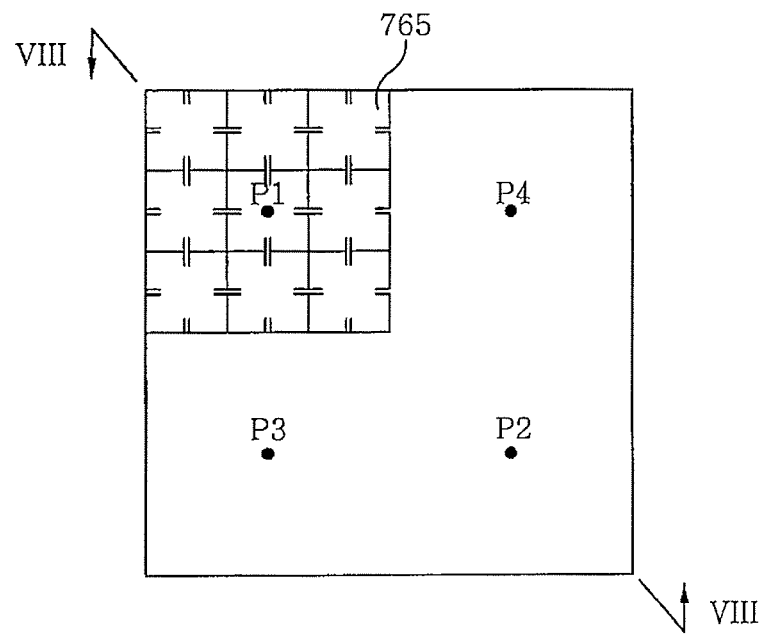
FIGS. 7A and 7B show electromagnetic-wave suppression structures partially formed on both power plane and ground plane.
Figure 7B:
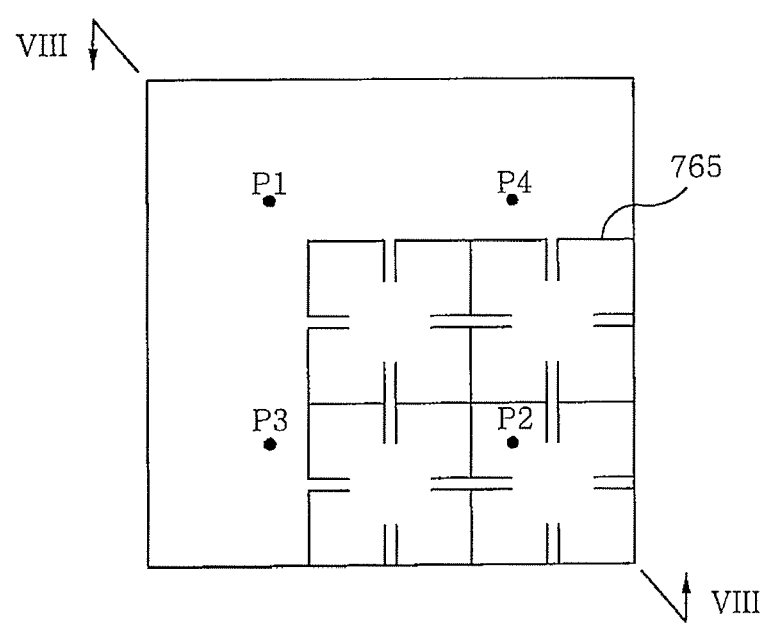

FIGS. 7A and 7B show electromagnetic-wave suppression structures partially formed on both power plane and ground plane, respectively. In FIG. 7A, nine relatively small EBG unit cells 765 are provided only near P1 in the ground plane. In FIG. 7B, four relatively larger EBG unit cells 765 are provided only near P2 in the power plane.

In these structures, EBG unit cells having different sizes are provided in some regions on the ground plane and the power plane. In the drawing, P1 to P4 indicate positions of ports used when measuring and simulating a noise suppression characteristic. As described with reference to FIG. 1, the return current path for a high speed signal does not always exist on the ground plane but on the power plane. Accordingly, an EBG unit cell is effectively provided even on the power plane to suppress SSN, as in the present embodiment. Further, even in this case, it is preferred in terms of a signal characteristic of the system that the return current path is formed using an empty space between EBG unit cells or a region in which the EBG unit cells are not provided.

Figure 8:
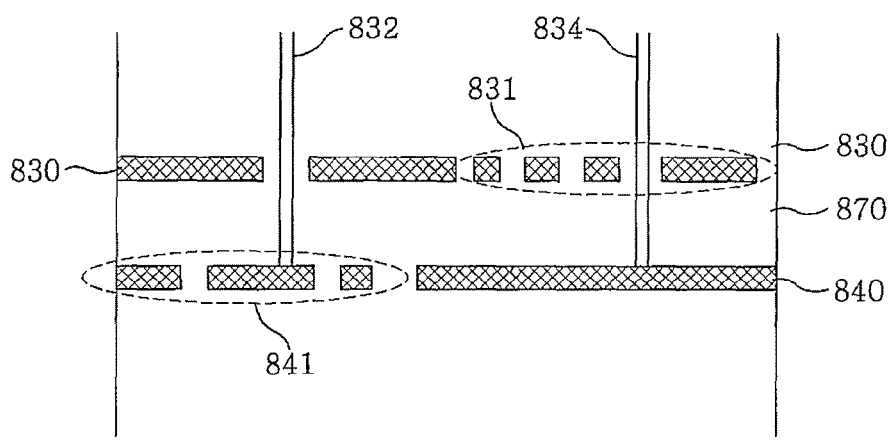
FIG. 8 shows a cross-sectional view of an electromagnetic-wave suppression structure which is partially formed on both power plane and ground plane.

FIG. 8 shows a cross-sectional view of electromagnetic-wave suppression structures which are partially formed on both power plane and ground plane.

In FIG. 8, the sectional view is obtained by taking along a line VIII-VIII of the structure shown in FIGS. 7A and 7B completely overlapped on Z-axis. In FIG. 8, an arrangement of: vias 832 and 834 respectively positioned in locations of P1 and P2; two EBG unit cells 841 on the line VIII-VIII section among four unit cells formed on the surface of the power plane 840; a region in which the EBG unit cells 841 are not provided; three EBG unit cells 831 on the line VIII-VIII among nine unit cells formed on a surface of a ground plane 830; a region in which EBG unit cells 831 are not provided; and a dielectric layer 870 is described.

Figure 9:
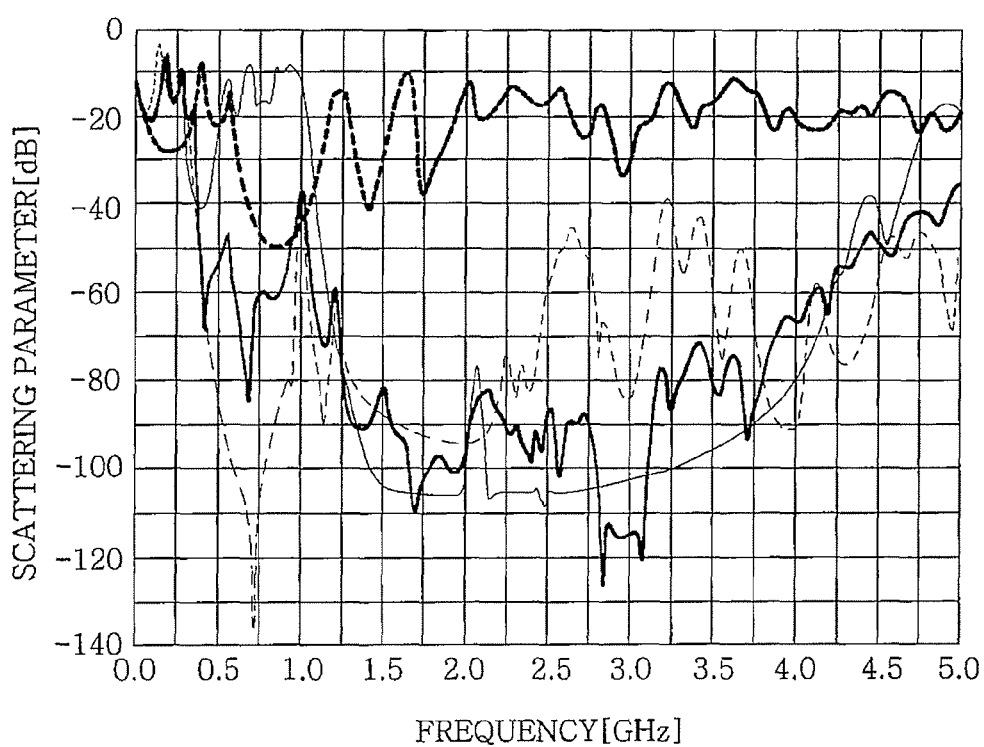
FIG. 9 shows a noise suppression characteristic of electromagnetic-wave suppression structures which are partially formed on both power plane and ground plane.

FIG. 9 shows noise suppression characteristic of an electromagnetic-wave suppression structure which is partially formed on both power plane and ground plane.

More specifically, FIG. 9 shows a noise delivery characteristic in ambient positions P2 to P4 when a noise source exists in a position P1 in FIGS. 7A and 7B. In the drawing, reference numeral "910" denotes a noise delivery characteristic when no EBG unit cell is provided on the power plane and the ground plane; "920" denotes a noise delivery characteristic when relatively small EBG unit cells like the EBG unit cells 765 in FIG. 7A are provided on both a power plane and a ground plane; and "940" denotes a noise delivery characteristic when relatively large EBG unit cells like the EBG unit cells 765 in FIG. 7B are provided in both the power plane and the ground plane. Further, "930" denotes a noise delivery characteristic when the EBG unit cells 765 are provided on the ground plane as shown in FIG. 7A and the EBG unit cells 765 are provided on the power plane as shown in FIG. 7B. These noise delivery characteristics are shown in scattering parameter [dB] unit with respect to a frequency band in a range from 0 to 5 GHz.

In FIGS. 7A and 7B, a region of a substrate used to apply an EBG includes the ground plane in FIG. 7A corresponding to ¼ (i.e., 25%) of an entire region and the power plane in FIG. 7b corresponding to 4/9 (i.e., about 44%). That is, about 35% of the entire region in average is applied with EBG. However, the noise delivery characteristic is substantially similar to the cases of "920" or "940" in FIG. 9 where the EBG of the small unit cells or large unit cells are provided on both the power plane and the ground plane. With the configuration in FIGS. 7A and 7B, the SSN of the noise source can be effectively shielded and the region in which no EBG is provided can be used as the return current path.

FIGS. 10A to 10F illustrate a variety of EBG structures. Further various electromagnetic-wave control structures including EBG structure of Mushroom form other than the structures provided in the present invention can be realized.

Figure 10A:
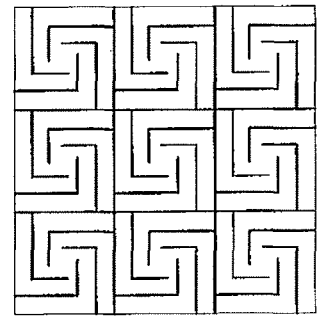
FIGS. 10A to 10F illustrate a variety of electromagnetic band-gaps.
Figure 10B:
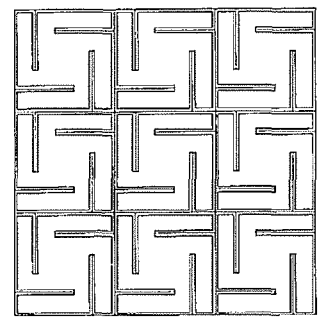
Figure 10C:
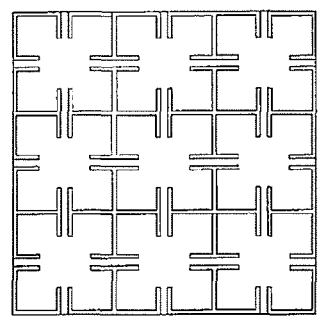
Figure 10D:
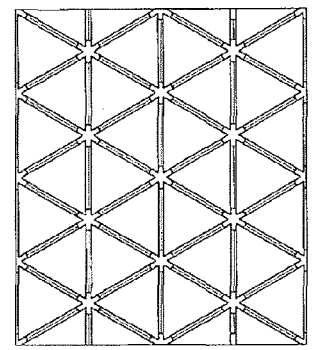
Figure 10E:
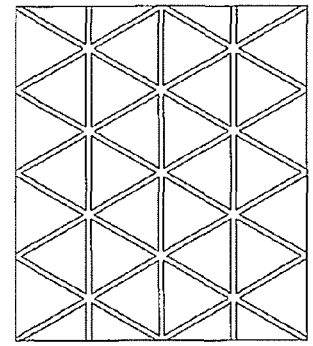
Figure 10F:
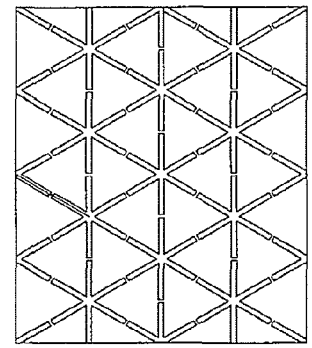

FIGS. 10A to 10C illustrate EBG structures each of which has a rectangular-patterned unit cells, and FIGS. 10D to 10F illustrate EBG structures each of which has triangle-patterned unit cells. In an electromagnetic suppression structure in accordance with the present invention, unit cells in which adjacent conductors are engaged with one another at certain intervals are arranged.

An electromagnetic-wave control structure in various forms including an electromagnetic band-gap structure in a mushroom form may be used to implement the electromagnetic-wave reduction structure.

In accordance with the present invention, SSN can be effectively reduced in a power distribution network (PDN) of a multi-layer PCB or package structure using a high speed signal and SI/PI and EMI characteristics can be improved.

Further, a signal characteristic and performance of a system can be improved by using a region in which an electromagnetic-wave suppression structure is not provided, as a return current path.

Furthermore, a suppression bandwidth can be widened by changing an arrangement of an electromagnetic-wave suppression structure that is provided in some regions, and noise can be suppressed to a desired level by adjusting the number of electromagnetic band-gaps.

While the invention has been shown and described with respect to the preferred embodiments, it will be understood by those skilled in the art that various changes and modifications may be made without departing from the spirit and scope of the invention as defined in the following claims.

What is claimed is:

1. An arrangement structure of electromagnetic-wave suppression structure in a multilayer PCB or package structure supplied with a power to be used therein by a power distribution network including a power plane and a ground plane, the multilayer PCB and package comprising:
   an electromagnetic-wave suppression structure including an electromagnetic band-gap; and
   the electromagnetic-wave suppression structure is formed at a specific portion(s) of the power plane and/or the ground plane to suppress noises,
   wherein the electromagnetic-wave suppression structure including the electromagnetic band-gap is formed partially or entirely on the both power plane and ground plane.

2. The arrangement structure of claim 1, wherein the electromagnetic-wave suppression structure is formed near a noise source or a device sensitive to an electromagnetic-wave.

3. The arrangement structure of claim 1, wherein regions in the power plane and the ground plane in which the electromagnetic-wave suppression structure is not formed are used as a return current path for a high speed signal.

4. The arrangement structure of claim 3, wherein a high speed signal line is formed on the regions in the power plane and ground plane in which the electromagnetic-wave suppression structure is not formed.

5. The arrangement structure of claim 1, wherein the electromagnetic-wave suppression structure is formed on one of the power plane and the ground plane.

6. The arrangement structure of claim 1, wherein the electromagnetic-wave suppression structure formed on the power plane is different from that formed on the ground plane in a size and form.

7. An arrangement structure of electromagnetic-wave suppression structure in a multilayer PCB or package structure supplied with a power to be used therein by a power distribution network including a power plane and a ground plane, the multilayer PCB and package comprising: an electromagnetic-wave suppression structure including an electromagnetic band-gap; and the electromagnetic-wave suppression structure is formed at a specific portion(s) of the power plane and/or the ground plane to suppress noises, wherein the electromagnetic-wave suppression structure including the electromagnetic band-gap has a band rejection characteristic with respect to a surface current.

8. The arrangement structure of claim 7, wherein the electromagnetic-wave suppression structure including the electromagnetic band-gap is formed by combining electromagnetic-wave suppression structures having a different cut-off frequency.

* * * * *